United States Patent
Agren

(10) Patent No.: US 9,507,142 B2
(45) Date of Patent: Nov. 29, 2016

(54) PRECISE DEFINITION OF TRANSDUCER ELECTRODES

(71) Applicant: SILEX MICROSYSTEMS AB, Jarfalla (SE)

(72) Inventor: Peter Agren, Huddinge (SE)

(73) Assignee: SILEX MICROSYSTEMS AB, Jarfalla (SE)

( * ) Notice: Subject to any disclaimer, the term of this patent is extended or adjusted under 35 U.S.C. 154(b) by 29 days.

(21) Appl. No.: 14/410,211

(22) PCT Filed: Jun. 12, 2013

(86) PCT No.: PCT/SE2013/050678
§ 371 (c)(1),
(2) Date: Dec. 22, 2014

(87) PCT Pub. No.: WO2013/191618
PCT Pub. Date: Dec. 27, 2013

(65) Prior Publication Data
US 2015/0370063 A1   Dec. 24, 2015

(30) Foreign Application Priority Data
Jun. 21, 2012  (SE) .................................... 1250672-1

(51) Int. Cl.
| | |
|---|---|
| G02B 26/08 | (2006.01) |
| H01L 23/48 | (2006.01) |
| B81B 3/00 | (2006.01) |
| B81C 1/00 | (2006.01) |
| G01D 5/24 | (2006.01) |
| H01L 23/522 | (2006.01) |

(52) U.S. Cl.
CPC ......... *G02B 26/0841* (2013.01); *B81B 3/0021* (2013.01); *B81B 3/0045* (2013.01);*B81C1/00357* (2013.01); *G01D 5/24* (2013.01); *G02B 26/085* (2013.01); *H01L 23/481* (2013.01); *B81B 2201/02* (2013.01); *B81B 2201/03* (2013.01); *B81B 2203/04* (2013.01); *B81C 1/00619* (2013.01); *H01L 23/5225* (2013.01); *H01L 2924/0002* (2013.01)

(58) Field of Classification Search
CPC ......... B81B 7/02; B81B 5/00; B81B 3/0021; B81B 3/0045; G02B 26/08; G02B 26/0841; G02B 26/085; H01L 21/30; H01L 21/768; H01L 23/522; H01L 23/481; B81C 1/00357; G01D 5/24
USPC ....................................................... 359/221.2
See application file for complete search history.

(56) References Cited

U.S. PATENT DOCUMENTS

| | | | |
|---|---|---|---|
| 6,716,657 B1 | 4/2004 | Soh | |
| 7,723,810 B2 | 5/2010 | Miller | |
| 2004/0155306 A1 | 8/2004 | Lee et al. | |
| 2010/0033800 A1 | 2/2010 | Ishii | |
| 2010/0214643 A1* | 8/2010 | Ostrom | G02B 26/0841 359/291 |
| 2012/0019886 A1 | 1/2012 | Ebefors et al. | |

* cited by examiner

FOREIGN PATENT DOCUMENTS

WO    2004/084300    9/2004

OTHER PUBLICATIONS

European Search Report dated May 4, 2016, in corresponding European Application No. 13806716.0.
International Search Report dated Oct. 11, 2013, corresponding PCT/SE2013/050678.

*Primary Examiner* — Euncha Cherry
(74) *Attorney, Agent, or Firm* — Young & Thompson

(57) ABSTRACT

A semiconductor device, includes a semiconductor substrate (10) having a first (12*a*) and a second (12*b*) side. There is provided at least one via (15) extending through the substrate (10) having first (16*a*) and second (16*b*) end surfaces, the first end surface (16*a*) constituting a transducer electrode for interacting with a movable element (14) arranged at the first side (12*a*) of the substrate (10). A shield (17) is provided on and covers at least part of the first side (12*a*) of the substrate (10), the shield/mask (17) including a conductive layer (19*a*) and an insulating material layer (19*b*) provided between the substrate (10) and the conductive layer (19*a*). The mask has an opening (18) exposing only a part of the first surface (16*a*) of the via. Preferably the opening (18) in the mask is precisely aligned with the movable element, and the area of the opening is accurately defined.

20 Claims, 5 Drawing Sheets

PRECISE DEFINITION OF TRANSDUCER ELECTRODES

TECHNICAL FIELD

This invention pertains to the field of MEMS (Micro Electrical Mechanical Systems) technology, and in particular to transducer electrodes interacting with movable members in MEMS devices.

BACKGROUND

When wafer-through connections, often denoted TSV (Through-Silicon-Vias), herein referred to as "vias", are made in semiconductor wafers, wherein the vias are made from wafer native material, as disclosed in applicants own WO 2004/084300, SOI wafers are often used. The vias are in this process formed by DRIE (Deep Reactive Ion Etch) etching of trenches defining the vias, through the handle layer of the SOI wafer. Commonly the depth of the trenches is 380-500 µm. Such deep trenches makes it difficult to precisely define the location and area of the surface of the via on the opposite side from where the DRIE is applied. This becomes a problem in applications where such a surface (i.e. of the via) is used as such, i.e. without further materials deposited, as an electrode for actuation of e.g. mirrors or other movable structures, or for sensing applications where small changes in e.g. capacitance is to be detected.

In U.S. Pat. No. 7,723,810 Miller et al disclose a MEMS device where there are no via structures present and the so called "hot electrodes" are shielded with "overhang" sections protruding over the electrodes so as to provide a shielding effect. The main purpose of this arrangement is to shield the electric field driving the micro-mirror both from the changing conductivity of the surrounding dielectric surfaces and the changing electric field conditions in adjacent micro-mirrors. This is solved by an overhang structure shielding the critical portions of the electrode structure causing unwanted field fluctuations.

SUMMARY OF THE INVENTION

In contrast to the cited prior art, it is one object of the invention to provide a highly accurately defined electrode surface area which is also very accurately positioned, i.e. aligned with a deflectable structure. In this way, on one hand a precise actuation of movable micro elements such as micro-mirrors, by masking off part of an exposed top surface of a via, e.g. a wafer-through connection, so as to provide a well defined electrode area, which is very well aligned with the movable member to be actuated, whereby actuation is controllable with a very high precision.

On the other hand this very accurately defined electrode surface (area and position) can be used as a sensing element for detecting fluctuations or movements in a movable/deflectable member, e.g. for accelerometer, gyroscope, resonator applications, and timing device.

This object is met by a device as defined in claim 1.

In a further aspect there is provided a method of making a device according to the invention. The method is defined in claim 8.

Embodiments are defined in the dependent claims.

The invention will now be described below with reference to the drawing figures.

DETAILED DESCRIPTION

DRIE (Deep Reactive Ion Etch) is commonly used in the MEMS field of technology. In particular the present inventors have used DRIE to develop a technology for making wafer-through vias, wherein the actual vias are made from wafer native material. This is disclosed in e.g. published international application WO 2004/084300.

For the purpose of this application the term "substrate native material" shall be taken to mean the material from which the starting wafer is made, regardless of if it is subsequently dope or not.

In the process of making the vias, in one embodiment trenches are etched from the handle side ("back-side") of a SOI wafer through the handle layer, where the buried oxide layer is used as an etch stop. Trenches are filled with an insulating material, and when the device layer subsequently is locally removed, the vias are exposed and the exposed via surface can be used as an electrode for actuating or sensing purposes.

However, the DRIE etch conditions typically varies over the surface of a processed wafer such that the defined trenches will not be perfectly vertical, resulting in vias being slightly off-set at the bottom.

This effect causes shift in the position of the vias at the device side ("front side") when etching is performed from the back-side of the wafer. Also, the trench width often varies due to variation of etch conditions. These effects will all contribute to variations in the electrode area. For precise actuation of movable (deflectable) elements such as micro-mirrors using via electrodes, it is of course of utmost importance that the size and position of the electrodes are very well defined in order that they can be aligned with the movable elements to the required precision. This also applies for precise sensing applications.

Figure 1:
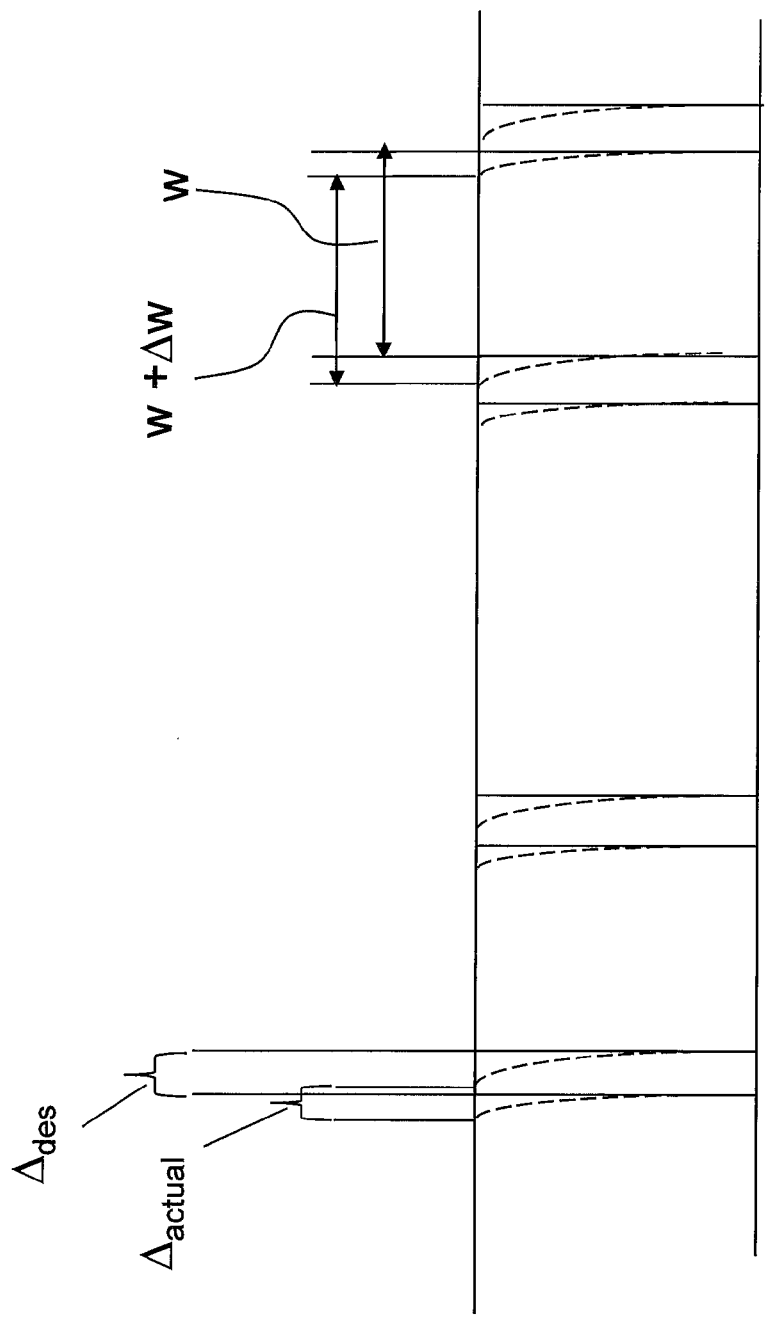
FIG. 1 illustrates schematically a problem with DRIE that renders via surfaces undefined in terms of location and surface area.

FIG. 1 illustrates schematically the problem associated with using DRIE to create deep and narrow trenches. Namely, that the ionized plasma will not be exactly vertical, causing a displacement of the trench bottom sideways, and also resulting in a width at the bottom $\Delta_{actual}$ that can be smaller than the desired width $\Delta_{des}$. Due to this effect, it is difficult to get a well defined electrode area and to align a deflectable member with the actuating electrode accurately enough. The latter is illustrated by showing the ideal width w and the actual width w+$\Delta$w.

Thus, in its most general aspect the present invention provides an electrode structure based on a wafer-through via where the active part of the electrode is the exposed via surface, and where the surface area constituting the active electrode area is precisely defined by masking off a selected portion of the exposed via surface.

The electrode is usable as a transducer element, i.e. it can be used either for actuating purposes, or for sensing purposes.

The invention provides a semiconductor device, comprising a semiconductor substrate having a first and a second side; at least one via extending through said substrate having first and second end surfaces, said first end surface constituting an transducer electrode for interacting with a movable element arranged at the first side of the substrate; a shield provided on and covering at least part of the first side of the substrate, the shield/mask comprising a conductive layer and an insulating material layer provided between the substrate and the conductive layer, said mask having an opening exposing only a part of the first surface of the via. Using the method the opening in the mask is precisely aligned with the deflectable element, and also the area of the opening is accurately defined.

It also provides a method of making a semiconductor device, comprising: providing a SOI wafer having a handle layer, a buried oxide layer and a device layer as a starting substrate; making via structures extending through the handle layer of the substrate; subjecting the device layer and the buried oxide layer to a patterning and etching process to provide an opening for exposing a part of the via, said opening having an accurately defined position and area; bonding further substrate(s) carrying deflectable structures to the SOI wafer whereby the exposed via surface is usable as a transducer electrode for interacting with said deflectable members.

Figure 2:
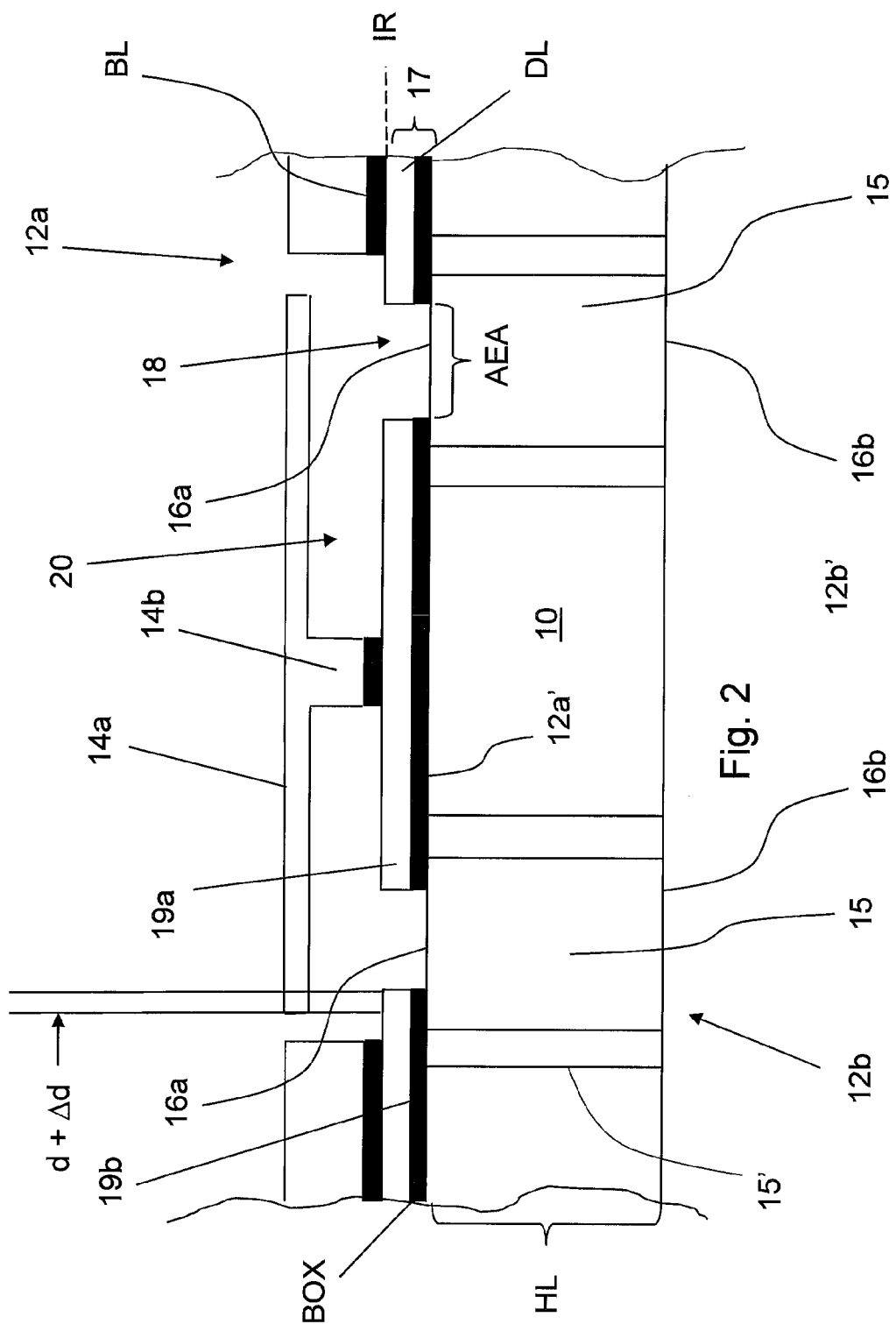
FIG. 2 shows a first embodiment of a shielded electrode surface structure.

FIG. 2 illustrates a first embodiment of the device according to the invention. This embodiment is a device having a deflectable structure, e.g. a micro-mirror 14a that is suspended on a post 14b. It comprises a semiconductor substrate 10 having a first side 12a and a second side 12b. The deflectable structure 14a is suspended in the post 14b extending upwards (as seen in the figure) on the first side 12a of the substrate. Here the mirror is suitably rendered deflectable by means of hinges. There is provided at least one via 15 extending through said substrate 10. The via has a first end surface 16a (top surface as seen in the figure) and second 16b end surface (bottom surface, as seen in the figure) which are flush with the respective top and bottom surfaces 12a', 12b' respectively, of the substrate, i.e. there is no level difference between the substrate surfaces and the via end surfaces.

In preferred embodiments the via comprises substrate native material. This is achieved by the particular manufacturing process employed, which is disclosed in applicants own WO 2004/084300. The via material can be suitably doped to provide a desired conductivity, or the substrate wafer used as a starting substrate can be doped in the wafer fabrication process.

The first end surface 16a of the via, i.e. the one on the first (top) side 12a of the substrate constitutes an actuating electrode for causing movement of said movable element 14. As discussed above, in the process of making the via, the geometry i.e. width and location of the trenches enclosing the via is difficult to control. In order to provide well defined electrodes despite this deficiency in the manufacturing process, the electrode surface is shielded according to the invention by the provision of a mask layer 17 on the first top surface 12a' of the substrate 10. The mask layer 17 covers at least part of the substrate and has an opening 18 with extremely well defined dimensions and lateral positions. This is made possible by virtue of the lithographic method used for making it. The mask layer 17 comprises a shielding layer 19a, suitably silicon, that provides the actual shielding function and an insulating material layer 19b provided between the substrate 10 and the shielding layer 19a. The opening 18 in the mask exposes only a part of the first (top) surface 16a of the via 15, whereby the active electrode area AEA will also be very well defined. Furthermore, the position of the opening 18 in the mask can easily be very precisely aligned with the deflectable structure 14a, by virtue of the lithographic methods used.

The lithographic methods are per se well known to the skilled man and will not be discussed in detail, since they are fundamental to MEMS engineering and any MEMS engineer will have studied such methods already in basic training. Thus, ordinary text books dealing with such methods are sufficient reference to enable the skilled man to understand how to precisely align various structures in the processes described herein, or to accurately position masks etc. to achieve the objects of the invention.

Thus, good alignment accuracy between the shield and the moveable element can be achieved using standard lithography techniques using e.g. an ASML stepper PAS 5500. This particular tool has a back-to-front alignment accuracy better than ±0.15 µm. The shield layer is first defined on the front side using back-to-front lithography alignment with respect to a reference alignment mark on the back side of the wafer. The shield is etched using DRIE and the resist is stripped. A second device layer is bonded on top of the shield layer. The moveable element is then defined on the front side by also using back-to-front lithography alignment with respect to the same reference alignment mark on the back side of the wafer. The moveable element is etched using DRIE and the resist is stripped. This results in an alignment error between the shield and the moveable element of better than ±0.3 µm.

Devices like the one shown in FIG. 2, i.e. with a mirror and an actuating electrode are always designed such that there is a slight overlap d of the mirror 14a over the electrode, which commonly is in the order of 10 µm. The misalignment tolerance is denoted Δd. By using the method according to the invention, the alignment tolerance, Δd, can be <5 µm, even as small as <1 µm, and <0.25 µm is attainable.

The active electrode area AEA, for e.g. a circular area with diameter d, is defined with an accuracy of Δd<1 µm.

The structure according to FIG. 2 is made using a SOI wafer as a starting substrate. Thus, vias 15 are made by etching trenches 15' through the handle layer HL of the SOI wafer using the buried oxide layer BOX of the SOI wafer as etch stop. After filling the trenches to provide insulation, the openings 18 are made by lithography. Here the device layer DL of the SOI wafer is used for the shield 19a, whereby it is possible to provide a "composite" shield layer 17 comprising material from the device layer and from the buried oxide. Thereby, the shield can be made with a highly accurate thickness.

Next, a second SOI wafer is processed such that the structures forming the deflectable members are made in the device layer of the SOI wafer. In particular a cavity 20 is made, which is required for providing free space in which the deflectable member can move, and if possible the entire component or component assembly/structure is finished already before bonding. The SOI wafer with its handle layer still in place is bonded to the substrate 10, which is provided with the shielding layer 17, whereby it will be an easy matter to align the deflectable members to the electrodes, since they are defined after bonding, due to the precision with which the openings in the shielding layer were made.

Also, if the mirror wafers have predefined patterns, the alignment is made in face-to-face mode which gives considerably better tolerances than in "back-side" alignment mode.

Bonding can be achieved by e.g. eutectic bonding or fusion bonding. In the first case the bonding interface will be a bonding layer shown as BL in the figure. If fusion bonding is used the bonding interface will of course not have the same thickness but can rather be thought of as a very thin interface region indicated at IR with a broken line.

After bonding, the handle layer of the second SOI wafer is removed to obtain the structure shown in FIG. 2, wherein as indicated above the bonding layer is shown as BL.

In case of e.g. mirrors as deflectable members, the actual mirror elements are only predefined in the device layer of the second SOI wafer, i.e. they are not free-hanging. Instead they are released by free-etching after the second SOI wafer has been bonded to the substrate wafer 10. In such case of course the handle layer of the second SOI wafer carrying the deflectable members (e.g. mirrors) must be removed after bonding before the free-etching can be made.

Figure 3:
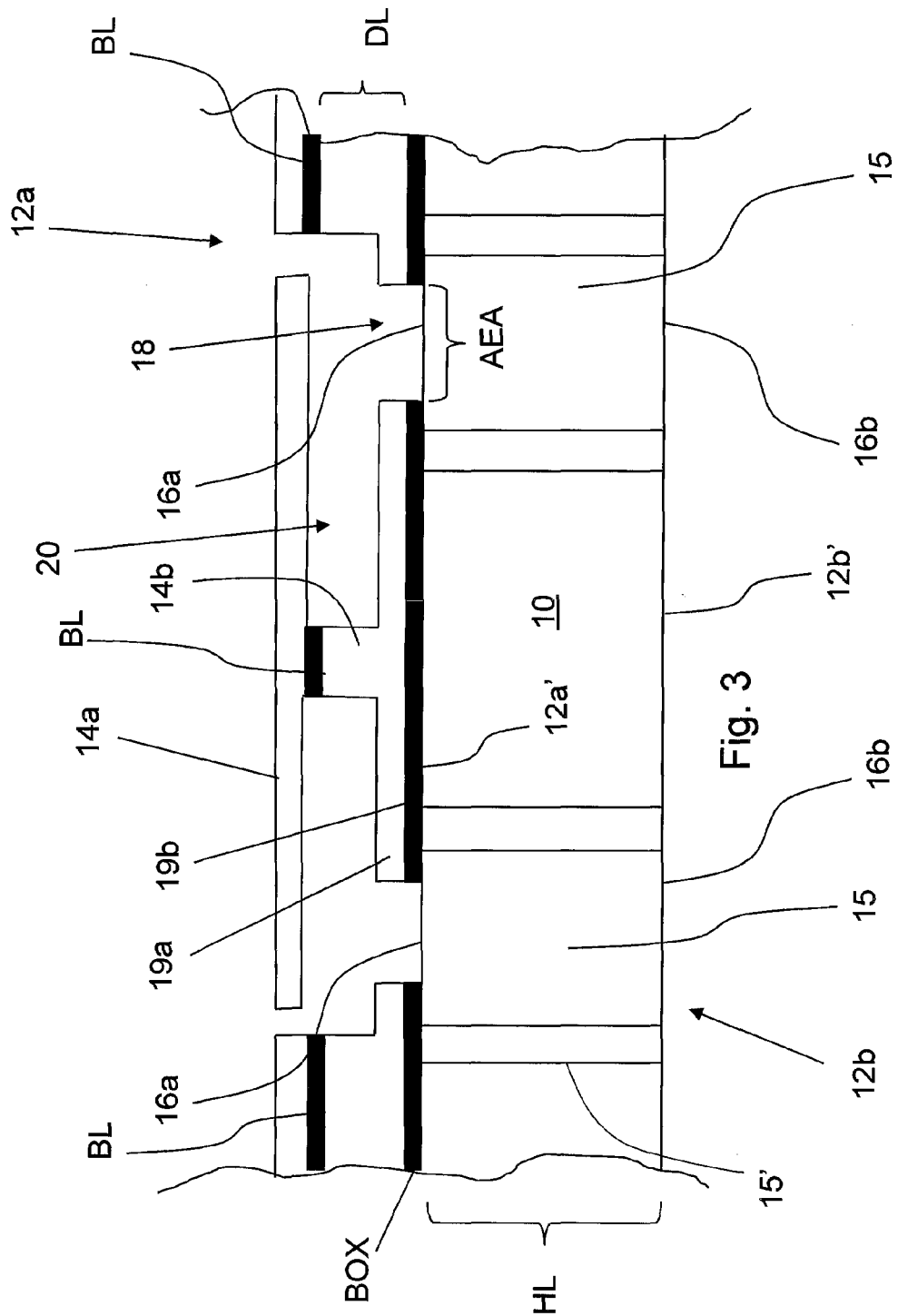
FIG. 3 shows a second embodiment of a shielded electrode surface structure.

In FIG. 3 a second embodiment of the device having deflectable members and shielded electrodes with well defined active surface according to the invention is shown. This embodiment is made by an alternative method. In this case again a SOI wafer is used but here the device layer DL is thicker.

Also this embodiment has a deflectable structure, e.g. a micro-mirror 14a that is suspended on a post 14b. It comprises a semiconductor substrate 10 having a first side 12a and a second side 12b. The deflectable structure 14a is suspended in the post 14b extending upwards (as seen in the figure) on the first side 12a of the substrate. There is provided at least one via 15 extending through said substrate 10. The via has a first end surface 16a (top surface as seen in the figure) and second 16b end surface (bottom surface, as seen in the figure) which are flush with the respective top and bottom surfaces 12a', 12b' respectively, of the substrate, i.e. there is no level difference between the substrate surfaces and the via end surfaces.

However, the difference from the embodiment of FIG. 2 is that the opening 18 and the cavity 20 are made in one and the same device layer DL of the first SOI wafer.

The openings 18 forming the precisely defined electrode area are made in a two-step process as follows.

Namely, via structures 15 are made as described above in connection with the first embodiment of FIG. 2.

Then, on the first (top) side 12a of the starting SOI wafer there is provided a first mask, which will define the boundaries of the cavity 20 in which the deflectable member is to be accommodated. Then, a second mask is provided over the first mask, the second mask defining the final electrode surface area and also its position, very accurately. Thus, this double mask now provides an opening through which an etch is applied to create a depression. However, suitably the etch is terminated at a depth which is a fraction only of the thickness of the device layer. Then the second mask is stripped off and a second etch is applied whereby material will be etched away both in the depression formed in the previous etch but also over the area defined by the first mask. This second etch is carried out such that it will stop when it has reached the buried oxide layer in the first SOI wafer. The oxide in the bottom of the depression is removed to expose the via top surface 16a.

This is but one way of making this structure, and the skilled man will conceive of alternative ways without inventive work.

In this embodiment there is no alignment required at all if fusion bonding is used for bonding the mirror wafer since the mirrors are suitably defined and made after bonding.

Figure 4:
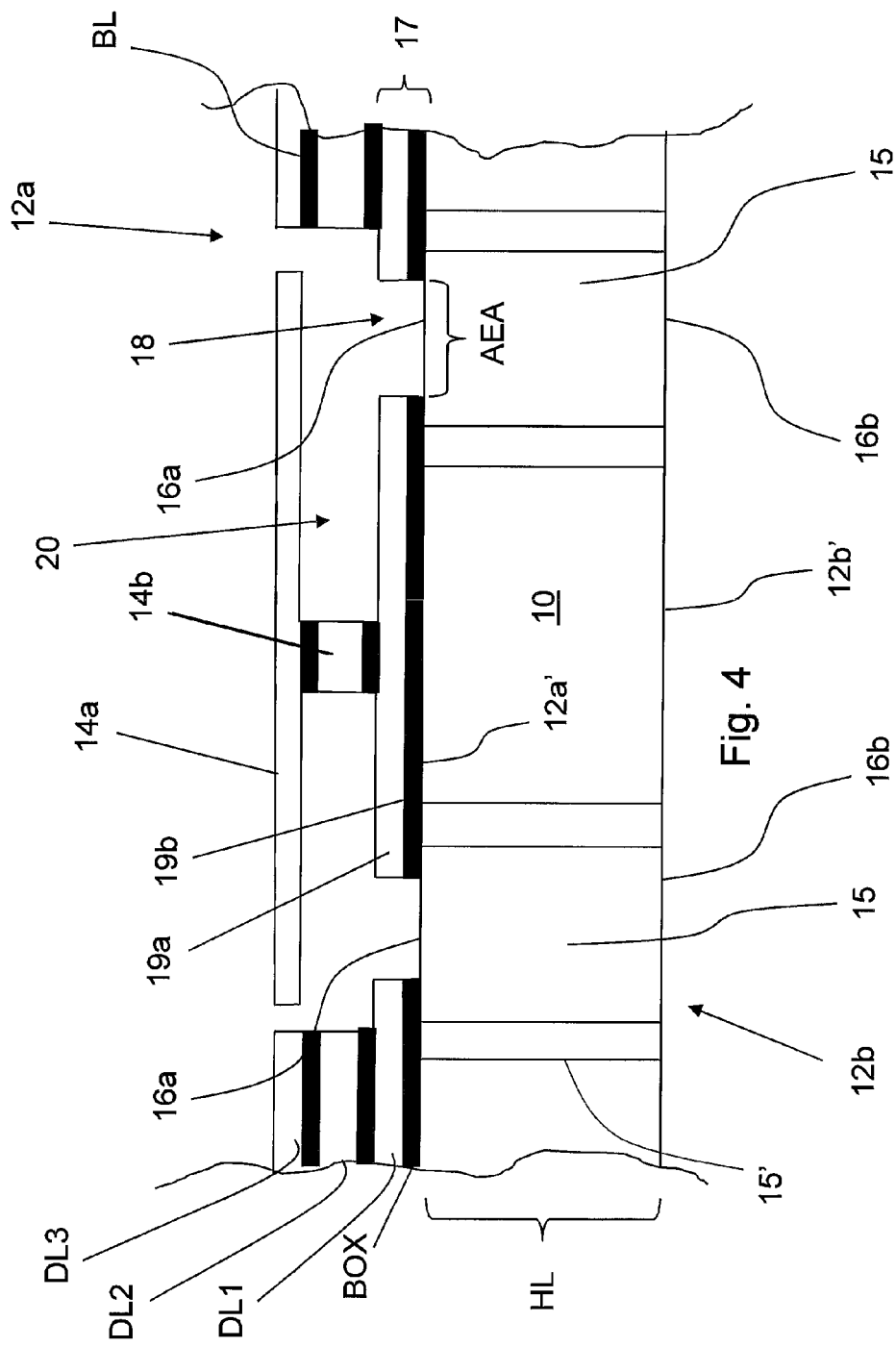
FIG. 4 shows a third embodiment of a shielded electrode surface structure.

In FIG. 4 still another embodiment is shown.

Here three SOI wafers are used. The advantage with this embodiment is that distances in the structure can be very accurately defined by using the device layers of the SOI wafers, the thickness of the device layers being known with high accuracy.

The first step of one way of performing a method of making the structure according to FIG. 4 is identical to the method corresponding to the embodiment of FIG. 2, i.e. a first SOI wafer is provided with vias 15, and openings 18 are made in the device layer DL1 and through the buried oxide BOX to expose the via top surface 16a. The remaining device layer material and buried oxide together form the shield layer 17.

Then, a second SOI wafer is processed by patterning and etching the device layer DL2 to provide a depression forming the device layer which is to form the cavity 20. The second SOI wafer is bonded to the first SOI wafer (DL2 against DL1). In this way both the thickness of the shield 17 and the depth of the cavity 20 will be very accurately defined since the thickness of the device layers DL1 and DL2, respectively of the SOI wafers are known to a very high accuracy.

Finally, a third SOI is processed to make the deflectable structures 14a in its device layer DL3. The third SOI wafer is bonded to the unit from the previous steps, and the handle is removed. This leaves the device layer DL3 exposed to enable free-etching of the deflectable structures.

Now, a method to make a device having a deflectable member will be described in a general manner.

Figure 5:
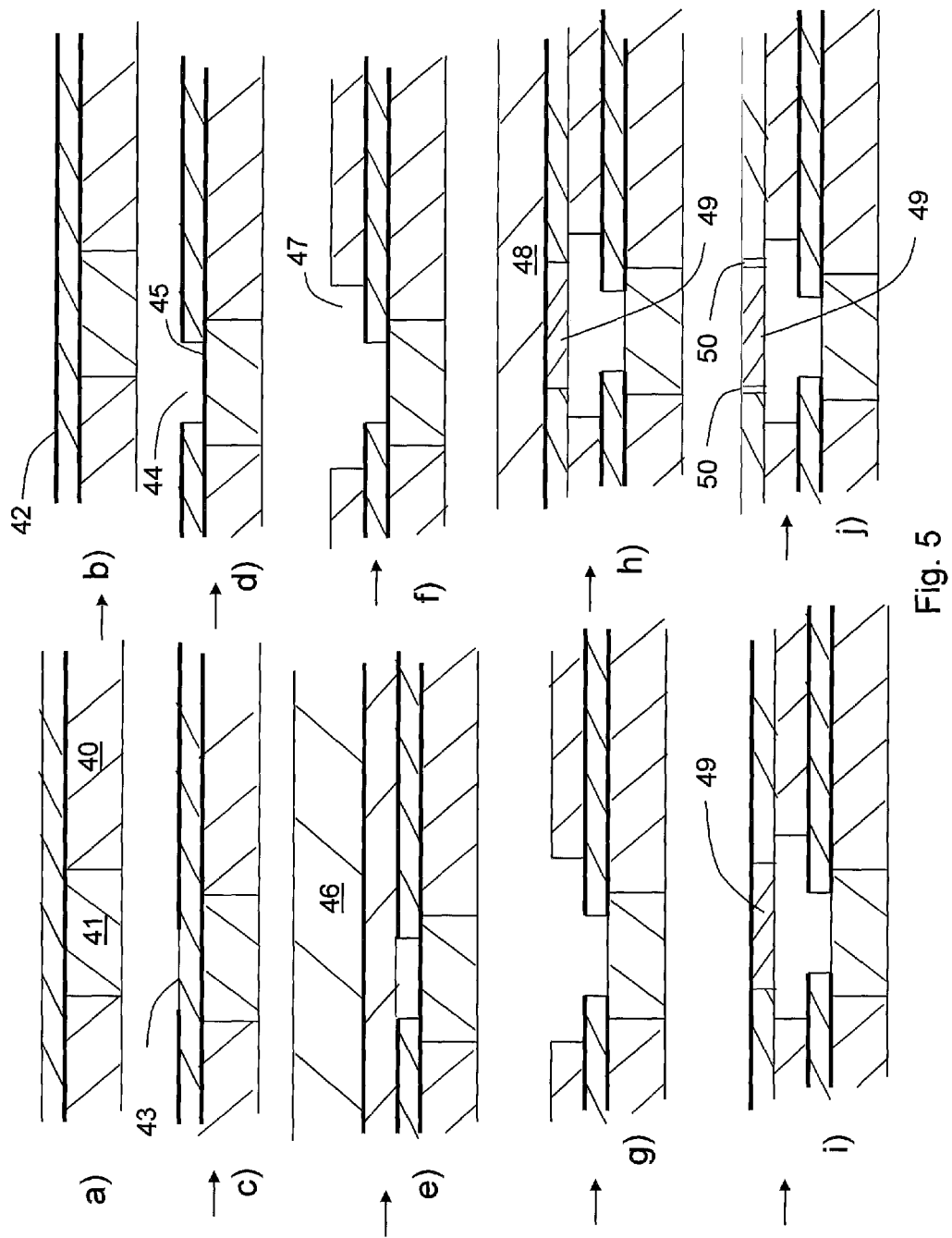
FIG. 5 shows a process flow for making an embodiment of a semiconductor device having an electrode with accurately defined surface area and position.

Thus, with reference to FIG. 5, the first step 4a) is the same as in the previous embodiments to make the vias 41 in a first SOI wafer 40.

Then, the first SOI wafer is provided with an etchable layer 42, 4b), e.g. an oxide or a resist covering the entire top surface. This surface is patterned and etched 4c) so as to be provided with an etch mask for a well defined opening 43 for an electrode surface. An etch is applied 4d) down to the buried oxide of the SOI wafer to make the depression 44 exposing the top surface of the via, thereby forming an electrode. Note that at this point the via material is still protected by the buried oxide 45 in the SOI wafer.

Now a second SOI wafer 46 is bonded 4e) to the structure from 4d). The handle and the oxide layer of the second SOI wafer is removed (not shown) and the device layer is patterned and etched 4f) to make the cavity 47 for accommodating the deflectable member. The oxide in the bottom of the opening from step 4d) acts as an etch stop so as to protect the via from being etched.

When the cavity etch is finished the protective oxide in the bottom of the opening is removed 4g) to expose the via top surface.

A third SOI wafer 48 is provided that comprises the deflectable member 49 (or a precursor thereof, i.e. the movable elements are still not released from the carrier) to be actuated by the via electrodes in the finished structure, and the SOI wafer is bonded 4h) to the structure from step 4g).

Then, the handle of the third SOI is removed 4i), and the oxide layer too, and the deflectable structure is free-etched 4j) (schematically shown by the etch grooves 50) to arrive at the final structure having a deflectable member precisely aligned with an actuating electrode having a very accurately defined surface area.

The structure schematically shown in FIG. 5 is usable as either a device having a deflectable member that can be actuated to move by applying a voltage to the electrode, or it can be used as a sensing device, whereby a change in capacitance can be detected due to movement of the deflectable member.

It should be noted that the methods described above are exemplary only and the skilled man will realize that there are numerous ways of altering the sequence of steps, in particular the etch steps. Thus, the method in its most general aspect is defined solely by the claims.

Also, it is possible to use other methods than etching for locally thinning a device in a well controlled manner, e.g. the so called LOCUS process, well known to the skilled man.

The invention claimed is:

1. A semiconductor device, comprising
a semiconductor substrate having a first and a second side;
at least one via extending through said substrate having first and second end surfaces, said first end surface constituting a transducer electrode for interacting with a movable element arranged at the first side of the substrate; and
a mask provided on and covering at least part of the first side of the substrate, the mask comprising a conductive layer and an insulating material layer provided between the substrate and the conductive layer, said mask having an opening exposing only a part of the first surface of the via.

2. The device according to claim 1, wherein the opening in the mask is aligned with the movable element.

3. The device according to claim 1, wherein the area of the opening is defined.

4. The device according to claim 1, wherein the transducer electrode is a sensor electrode for detecting a change in capacitance due to movement of the movable element.

5. The device according to claim 1, wherein the transducer electrode is an actuating electrode for causing deflection of the moveable element.

6. The device according claim 1, wherein first and second end surfaces are flush with the respective sides of the substrate.

7. The device according to claim 1, wherein the movable member is a mirror.

8. The device according to claim 7, wherein the mirror is suspended on a post extending upwards on the first side of the substrate.

9. The device according to claim 8, wherein the mirror is suspended by means of hinges.

10. The device according to claim 1, wherein the via comprises substrate native material.

11. The device according to claim 1, wherein the alignment tolerance in the alignment of movable member and electrode is <5 μm.

12. A method of making a semiconductor device, comprising:
providing a SOI wafer having a handle layer, a buried oxide layer and a device layer as a starting substrate;
making via structures extending through the handle layer of the substrate;
subjecting the device layer and the buried oxide layer to a patterning and etching process to provide an opening for exposing a part of the via, said opening having a defined position and area;
bonding further substrate(s) carrying movable structures to the SOI wafer whereby the exposed via surface is usable as a transducer electrode for interacting with said movable structures.

13. The method according to claim 12, wherein the further substrate(s) is/are aligned to the transducing electrodes.

14. The method according to claim 12, wherein the opening is part of a mask provided on and covering at least part of the first side of the substrate.

15. The method according to claim 14, wherein the vias are made by etching trenches through the handle layer of the SOI wafer using the buried oxide layer of the SOI wafer as etch stop; after filling the trenches to provide insulation, the openings are made by lithography; wherein the device layer of the SOI wafer is used for the mask, whereby it is possible to provide a composite mask layer comprising material from the device layer and from the buried oxide.

16. The method according to claim 12, wherein the further substrate(s) is/are further SOI wafers.

17. A device having a deflectable structure is suspended on a post, and comprising a semiconductor substrate having a first side and a second side; the deflectable structure is suspended in the post extending upwards on the first side of the substrate, said post being bonded to the substrate; the mirror is rendered deflectable by means of hinges; at least one via extending through said substrate, the via having a first end surface and second end surface which are flush with the respective top and bottom surfaces, respectively, of the substrate; and a mask provided on and covering at least part of the first side of the substrate, the mask comprising a conductive layer and an insulating material layer provided between the substrate and the conductive layer, said mask having an opening exposing only a part of the first surface of the via; wherein there is no level difference between the substrate surfaces and the via end surfaces.

18. The device according to claim 17, wherein the via comprises substrate native material.

19. A device having deflectable members and shielded electrodes with well defined active surface, comprising a deflectable structure suspended on a post; comprising a semiconductor substrate having a first side and a second side; the deflectable structure is suspended in the post extending upwards on the first side of the substrate; at least one via extending through said substrate; the via has a first end surface and a second end surface which are flush with the respective top and bottom surfaces, respectively, of the substrate; and a mask provided on and covering at least part of the first side of the substrate, the mask comprising a conductive layer and an insulating material layer provided between the substrate and the conductive layer, said mask having an opening exposing only a part of the first surface of the via; said post being formed in the conductive layer; wherein there is no level difference between the substrate surfaces and the via end surfaces.

20. The device according to claim 19, wherein the via comprises substrate native material.

* * * * *